(12) United States Patent
Zmood et al.

(10) Patent No.: US 10,608,624 B2
(45) Date of Patent: Mar. 31, 2020

(54) EFFICIENT SWITCHING CIRCUIT

(71) Applicant: Solaredge Technologies Ltd., Herzeliya (IL)

(72) Inventors: Daniel Zmood, Ness Ziona (IL); Tzachi Glovinsky, Petah Tikva (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 15/984,516

(22) Filed: May 21, 2018

(65) Prior Publication Data

US 2018/0343002 A1    Nov. 29, 2018

Related U.S. Application Data

(63) Continuation of application No. 62/510,838, filed on May 25, 2017.

(51) Int. Cl.
*H03K 17/06*     (2006.01)
*H03K 17/567*    (2006.01)
*H03K 17/10*     (2006.01)
*H03K 17/16*     (2006.01)
*H03K 17/12*     (2006.01)
*H03K 17/687*    (2006.01)

(52) U.S. Cl.
CPC ......... *H03K 17/063* (2013.01); *H03K 17/102* (2013.01); *H03K 17/164* (2013.01); *H03K 17/567* (2013.01); *H03K 17/122* (2013.01); *H03K 17/6871* (2013.01); *H03K 2217/0036* (2013.01); *H03K 2217/0054* (2013.01)

(58) Field of Classification Search
CPC .. H03K 17/063; H03K 17/164; H03K 17/102; H03K 17/567; H03K 17/6871; H03K 17/122; H03K 2217/0036; H03K 2217/0054
See application file for complete search history.

(56) References Cited

U.S. PATENT DOCUMENTS

| | | | | |
|---|---|---|---|---|
| 5,155,289 A * | 10/1992 | Bowles | ............... | H03K 17/567 124/3 |
| 6,111,390 A * | 8/2000 | Inaba | ................ | H02K 21/046 310/156.26 |
| 6,118,311 A * | 9/2000 | Kamiya | ............... | H03K 17/167 327/112 |
| 6,118,324 A * | 9/2000 | Li | ....................... | H03K 17/164 326/26 |
| 6,249,111 B1 | 6/2001 | Nguyen | | |
| 7,034,575 B2 * | 4/2006 | Gallo | ................... | G11C 7/1051 326/83 |

(Continued)

OTHER PUBLICATIONS

Sep. 28, 2018—EP Search Report for EP App 18174053.1.

*Primary Examiner* — Thomas J. Hiltunen
(74) *Attorney, Agent, or Firm* — Banner & Witcoff, Ltd.

(57) ABSTRACT

A switching device includes a first leg having a plurality of transistors connected in series. The switching device also includes a second leg having a transistor, connected in parallel to the first leg. The switching device further includes a controller controlling the plurality of transistors and the transistor. The controller is configured to turn the switching device from a first state to a second state by first turning the transistor from the first state to the second stat and then turning the plurality of transistors from the first state to the second state.

18 Claims, 6 Drawing Sheets

(56) References Cited

U.S. PATENT DOCUMENTS

| | | | | |
|---|---|---|---|---|
| 7,230,470 B1* | 6/2007 | You | ............... | H03K 17/082 327/427 |
| 7,391,133 B1* | 6/2008 | Hennessy | ............ | H03K 17/102 307/113 |
| 7,741,883 B2* | 6/2010 | Fuller | ............... | H03K 17/284 327/108 |
| 8,791,662 B2* | 7/2014 | Tanaka | ............... | H01L 25/07 318/494 |
| 8,947,951 B2* | 2/2015 | Baeck | ............... | G11C 7/12 365/189.11 |
| 8,994,442 B2* | 3/2015 | Konstantinov | ...... | H03K 17/164 327/433 |
| 10,033,378 B2* | 7/2018 | Turvey | ............ | H03K 17/08142 |
| 2003/0038615 A1 | 2/2003 | Elbanhawy | | |
| 2011/0273219 A1 | 11/2011 | Marotta et al. | | |
| 2012/0057387 A1 | 3/2012 | Lai et al. | | |
| 2012/0268091 A1* | 10/2012 | Takemae | ............ | H02M 3/158 323/272 |

* cited by examiner

EFFICIENT SWITCHING CIRCUIT

RELATED APPLICATIONS

This application claims priority to U.S. provisional application Ser. No. 62/510,838, filed May 25, 2017, entitled "Efficient Switching Circuit," the entire contents of which are incorporated herein by reference BACKGROUND In certain circuits, it is sometimes desirable to serially connect a plurality of transistors to from an equivalent switch having an increased effective voltage blocking capability. Series connection of insulated-gate bipolar transistors (IGBTs) and other high voltage switches have been used in series connection for medium and high voltage applications, which generally entails utilizing some means of static and dynamic balancing of the voltages across the devices to ensure reliable operation, which effectively add losses to the system, and therefore are generally applied to low-frequency switching applications. There is a need for and it would be advantageous to have arrangements of low-voltage switches (e.g., low-voltage MOSFETs) and methods of operation of the low-voltage switches to enable cost effective, efficient switching at high-frequency.

SUMMARY

The following summary may be a short summary of some of the inventive concepts for illustrative purposes only, and may be not intended to limit or constrain the inventions and examples in the detailed description. One skilled in the art will recognize other novel combinations and features from the detailed description.

Embodiments disclosed herein may include low-voltage switch arrangements and methods for operation thereof. Illustrative embodiments include employing stacked (i.e., serially-connected) low-voltage (LV) metal-oxide-semiconductor field-effect transistors (MOSFETs) to form an equivalent switch having an increased voltage blocking capability. In some embodiments, the low-voltage MOSFETs (LVMs) are oriented to block a voltage in one direction, and in some embodiments the LVMs are oriented to block a voltage in two directions.

In some embodiments, stacked LVMs may form a first switch leg, with a second switch leg connected in parallel to the first switch leg. The second switch leg may include one or more switches (e.g., high-voltage MOSFETs (HVMs) and/or IGBTs)). Suitable timing of the switching of the first leg switches and the second leg may reduce switching and conduction losses associated with switching, and may reduce risk of switch breakdown (e.g., due to a large reverse voltage) during switching.

In some embodiments, a third switch leg may be connected in parallel with the first and second legs. The third leg may feature one or more transistors and/or diodes selected to provide efficient reverse recovery during switching of the first and/or second legs.

In some embodiments, a switch circuit having one or more legs may be assembled using discrete components available for individual purchase. In some embodiments, a switch circuit having one or more legs may be assembled and packaged as a single printed circuit board (PCB) or module, with control and power terminals made available outside the assembly. In some embodiments, a switch circuit having one or more legs may be manufactured at the fabrication level (e.g., integrated in silicon).

BRIEF DESCRIPTION OF THE DRAWINGS

These and other features, aspects, and advantages of the present disclosure will become better understood with regard to the following description, claims, and drawings. The present disclosure is illustrated by way of example, and not limited by, the accompanying figures.

DETAILED DESCRIPTION

In the following description of various illustrative embodiments, reference is made to the accompanying drawings, which form a part hereof, and in which is shown, by way of illustration, various embodiments in which aspects of the disclosure may be practiced. It is to be understood that other embodiments may be utilized and structural and functional modifications may be made, without departing from the scope of the present disclosure.

Figure 1:
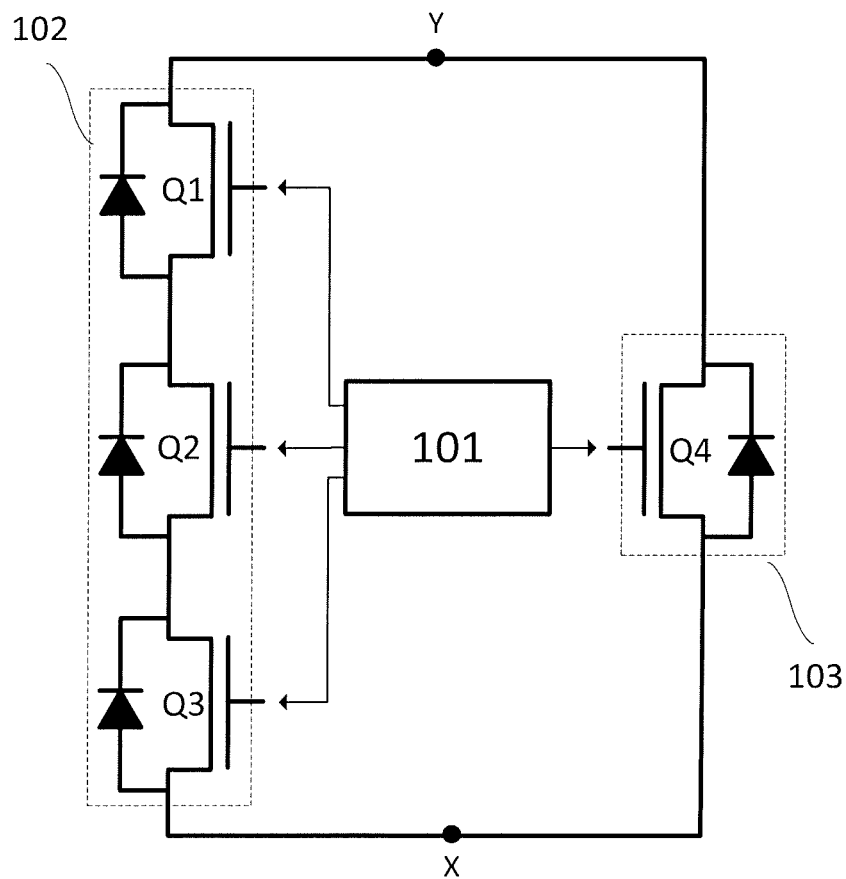
FIG. 1 is part schematic, part block diagram according to one or more illustrative embodiments.

Reference is now made to FIG. 1, which illustrates a switch circuit according to illustrative embodiments. Switch circuit 100 may feature a first leg 102 having switches Q1, Q2 and Q3 connected in series between terminals X and Y. Switches Q1-Q3 may be low-voltage MOSFETs (LVMs), for example, MOSFETs rated to block a drain-to-source voltage of about 100V (e.g. 50V, 80V, 100V, 120V, 150V, 200V, etc.). Switches Q1-Q3 may be stacked (i.e., serially connected) in a source-to-drain configuration, such that the body diodes of switches Q1-Q3 are oriented in the same direction (i.e., the anode of the parasitic diode of switch Q1 is connected to the cathode of the parasitic diode of switch Q2, and the anode of the parasitic diode of switch Q2 is connected to the cathode of the parasitic diode of switch Q3), to increase the voltage blocking capability of first leg 102. For example, if each of switches Q1-Q3 is an 80V switch (i.e., is rated to withstand a voltage of 80V), first leg 102 may have an equivalent rating of 80*3=240V.

Stacking low-voltage switches to achieve a higher voltage rating may provide certain advantaged compared to using a single high-voltage switch. For example, three serially connected 100V MOSFETs may have a total conduction resistance ($R_{ds,on}$) that may be significantly lower than the conduction resistance of a single 250V MOSFET. For example, a single 100V MOSFET may have $R_{ds,on}$=2 m$\Omega$, while a single 250V MOSFET may have $R_{ds,on}$=50 m$\Omega$. Since conduction losses are given by $P_{loss,conduction}=I_{on}^2 \cdot R_{ds,on}$, the conduction losses incurred by serially connected LVMs may be significantly lower than conduction losses incurred by a HVM.

Serially connecting LVMs may present certain challenges when switching the LVMs between states. For example, switches Q1-Q3 are serially connected between terminals X and Y and in the OFF position, and it is desired to switch the switches to the ON state, timing the switching to be simultaneous may be challenging (e.g., because of manufacturing variations between the switches Q1-Q3 which may require three different gate-to-source voltages to drive the three switches to the ON state. Further, a controller may be configured to output three simultaneous control signals, and timing variation might reduce the effectiveness of the control signal. Additionally, timing variation between the control signals may result damage to one or more of the switches. For example, if switches Q1 and Q2 are switched to the ON state before switch Q3, the drain-to-source voltage across switch Q3 may be large (e.g., 200V, above switch Q3's voltage ratings) and may cause damage to switch Q3. Similarly, when switching switches Q1-Q3 from the ON state to the OFF state, timing and/or manufacturing variations may cause damage (e.g., due to avalanche breakdown) to one or more of switches Q1-Q3.

A second leg 103 may be connected in parallel to first leg 102. Second leg 103 may include a high-voltage switch or switches (e.g., a high-voltage MOSFET (HVM), or multiple parallel-connected HVMs which may increase a peak current rating of the second leg) Q4 rated to withstand a full voltage between nodes X and Y. For example, second leg 103 may be rated to withstand 600V. By switching the state of switch Q4 in tandem with switches Q1-Q3, the operational challenges of operating switches Q1-Q3 may be partially or fully alleviated. For example, when switching the state of switch circuit 100 from the OFF state to the ON state, switch Q4 may be switched to the ON state before switches Q1-Q3. By switching the state of switch Q4 before switches Q1-Q3, the voltage stress across switches Q1-Q3 may be significantly reduced (e.g., the voltage stress may be close to 0V), reducing the risk of timing variation causing damage to one of switches Q1-Q3. Furthermore, the switching of switches Q1-Q3 may induce low switching losses due to the low-voltage drop across switches Q1-Q3 during the switching (i.e., near Zero Voltage Switching). After switch Q4 and switches Q1-Q3 are switched ON, switch Q4 may be switched OFF (with switches Q1-Q3 providing a current path), or switch Q4 may remain ON, to provide an additional current path (though switch Q1-Q3 may provide the main current path due to the low $R_{ds,on}$ parameters of switches Q1-Q3).

In some embodiments, switch Q4 may be implemented using a wide gap band transistor, for example, a Silicon Carbide (SiC) or a Gallium Nitride (GaN) transistor. Using a wide gap band transistor may provide enhanced reverse recovery compared to a HV MOSFET.

Switches Q1-Q4 may be controlled by a controller 101. Controller 101 may be or include an analog controller, microprocessor, Digital Signal Processor (DSP), Application-Specific Integrated Circuit (ASIC), and/or a Field Programmable Gate Array (FPGA). Controller 101 may time the switching of switches Q1-Q4 to reduce switching and conduction losses during operation of switch circuit 100.

Figure 2:
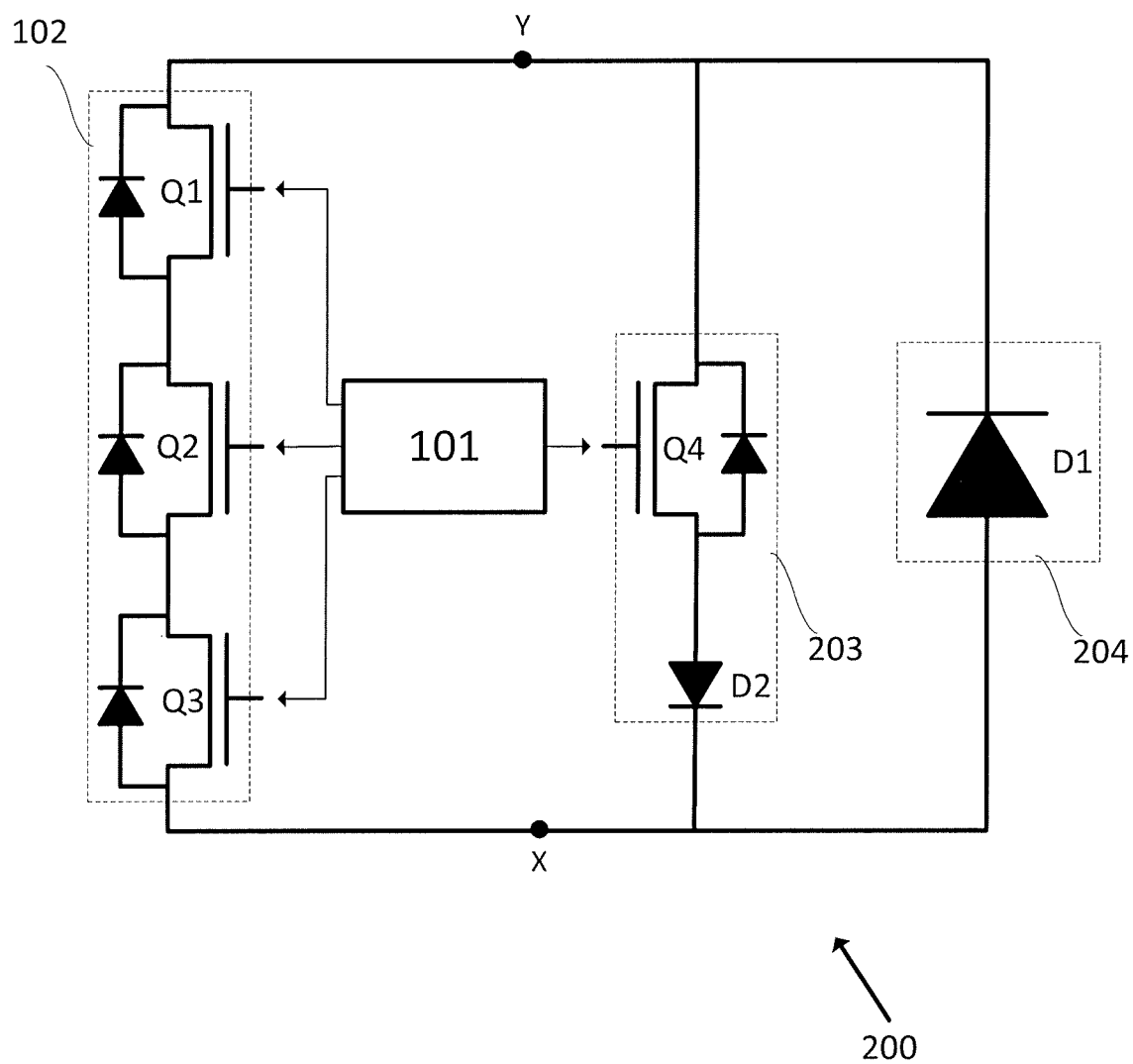
FIG. 2 is part schematic, part block diagram according to one or more illustrative embodiments.

Reference is now made to FIG. 2, which illustrates a switch circuit according to illustrative embodiments. Switch circuit 200 may feature a first leg 102 having switches Q1, Q2 and Q3 connected in series between terminals X and Y. First leg 102 may be the same as first leg 102 of FIG. 1. Second leg 203 may include switch Q4 which may be the same as switch Q4 of FIG. 1, and may further include diode D2 serially connected to switch Q4. Diode D2 may be oriented to prevent current from flowing through the body diode of switch Q4 (which may be desirable where the body diode is low-quality, i.e., lossy). Third leg 204 may include diode D1 disposed such that the cathode of diode D1 is connected (e.g., coupled) to node Y and the anode of diode D1 is connected (e.g., coupled) to node X. Diode D1 may be, for example, a silicon-carbide diode. Diode D1 may have a relatively low conduction voltage, to provide an efficient (e.g., having low-losses) current path between nodes X and Y and to reduce the reverse-recovery energy loss (when switching from ON to OFF) of switch circuit 200.

Figure 3:
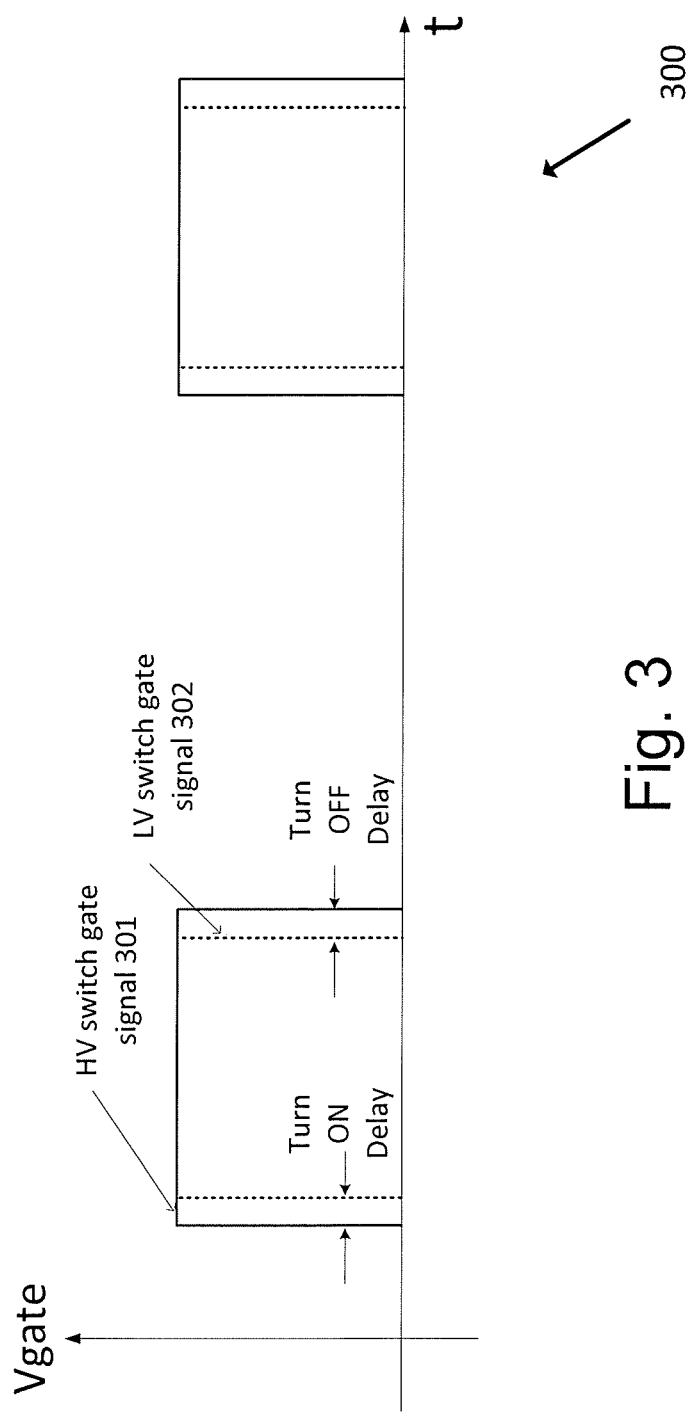
FIG. 3 is a timing diagram according to one or more illustrative embodiments.

Reference is now made to FIG. 3, which illustrates a timing diagram for operating (e.g., via a controller 101 of FIG. 1) a switch circuit, for example, switch circuits 100 (FIG. 1) or 200 (FIG. 2). Timing diagram 300 shows gate voltage signals which may be applied to switches Q1-Q4 of FIG. 1 or FIG. 2. Timing diagram 300 shows a HV switch gate signal 301 and a LV switch gate signal 302. The HV and LV switches may be operated as follows:

a. When switching from OFF to ON, The HV switch (e.g., Q4) may be turned ON, conducting current and reducing the voltage across the LV switches.

b. After a suitably short delay, the LV switches may be turned on and short out the HV switch, providing a significantly lower conduction path for the main current. If the LV switches have an intrinsically larger switching delay than the HV switch, the controller operating the LV and HV switches might not insert any delay.

c. After the required ON time, the LV switches may be turned off and the current may commutate back to the HV switch.

d. Again after a suitable short delay, the HV switch may be switched off and its drain-source voltage may rise.

Figure 4:
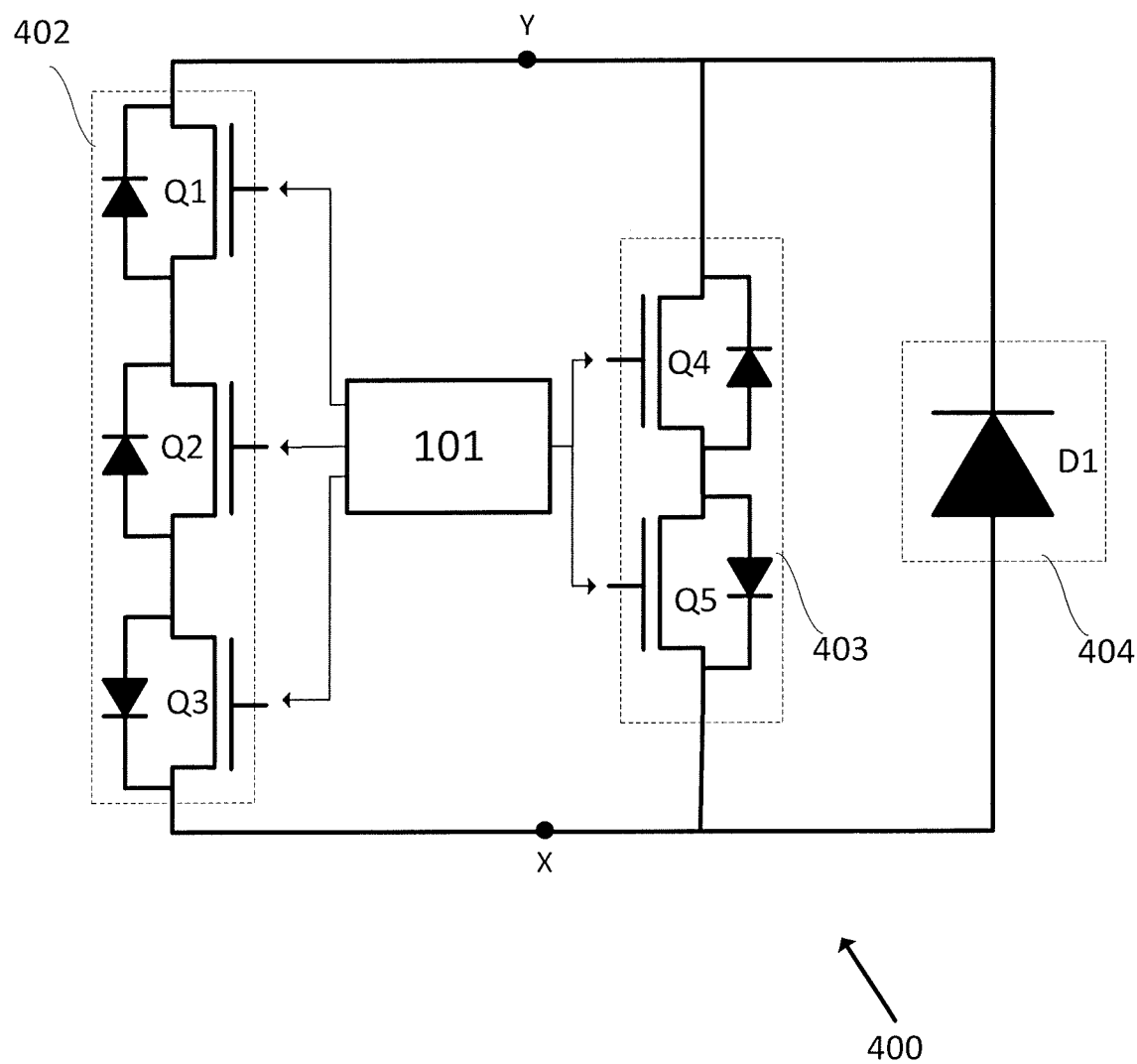
FIG. 4 is part schematic, part block diagram according to one or more illustrative embodiments.

Reference is now made to FIG. 4, which shows a switch circuit 400 according to illustrative embodiments. Switch circuit 400 may comprise a first leg 402, a second leg 403 and a third leg 404. First leg 402 may include a series-connected group of LV switches Q1-Q3. Switches Q1 and Q2 may be oriented in a first direction, and switch Q3 may be oriented in a second direction (e.g., the anodes of switches Q2 and Q3 may be connected to a common node). Switch Q3 may be an a LV switch (e.g., having a voltage rating of 80V-120V) or an ultra-LV switch (e.g., may have a voltage rating of about 30V) and may be operated to improve commutation of switch circuit 400 by "forcing" current out of the body diodes of switches Q1 and Q2 when they are operating in rectification mode and into switch Q4 prior to turning switches Q4 and Q5 OFF.

In some embodiments, switch Q3 may be replaced with a diode (e.g., a Schottky diode) connected back-to-back with switch Q1 or with switch Q2, and the diode may similarly serve to prevent current from flowing through the body diodes of switches Q1 and Q2.

Second leg 403 may be connected in parallel to first leg 402 and may feature back-to-back (e.g., having connected anodes) HV switches Q4 and Q5. Switch Q5 may serve to block current from flowing through the body diode of switch Q4 (similarly to diode D2 of FIG. 2). Third leg 404 may be similar to or the same as third leg 204 of FIG. 2, and may comprise diode D1.

First leg 402, second leg 403 and third leg 404 may be controlled by controller 101, which may be the same as or similar to controller 101 of Fig.

Third leg 404 might not be featured in certain embodiments. For example, where the second leg 403 features switches having reasonably high-quality body diodes (e.g., HV Gallium-Nitride (GaN) switches) and/or good reverse recovery characteristics (e.g., low reverse recovery losses).

Figure 5:
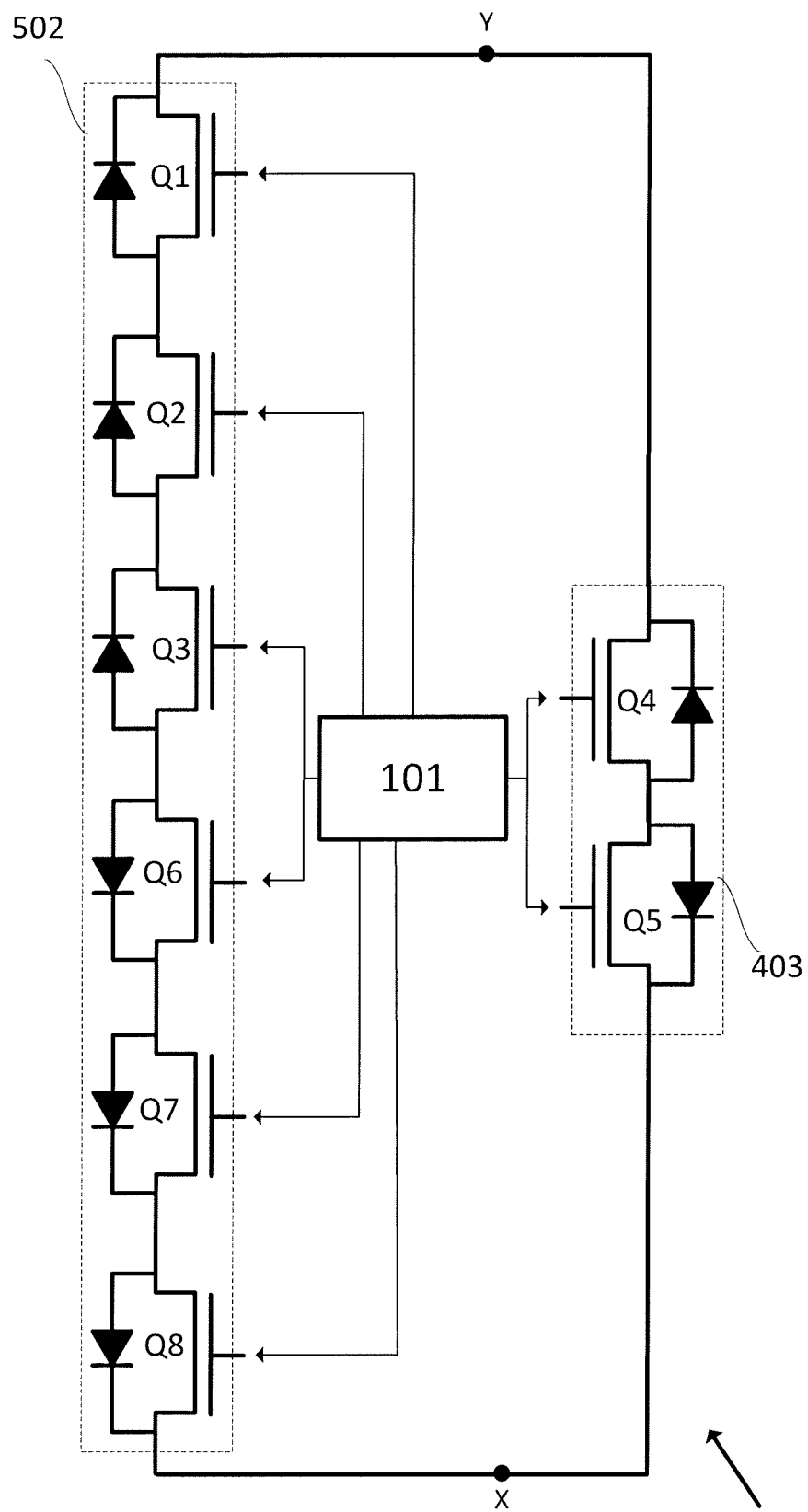
FIG. 5 is part schematic, part block diagram according to one or more illustrative embodiments.

Reference is now made to FIG. 5, which shows a switch circuit 500 according to illustrative embodiments. Switch circuit 500 may be a bidirectional switch circuit, designed and operated to allow controlling current flow from node X to node Y and/or from node Y to node X. First leg 502 may include a first series-connected group of LV switches Q1-Q3 oriented in a first direction (e.g., having body diodes oriented to block current from flowing from node Y to node X) and a second series-connected group of LV switches Q6-Q8 oriented in a second direction (e.g., having body diodes oriented to block current from flowing from node X to node Y). By using two back-to-back groups of serially connected LV switches, first leg 502 may provide a high bidirectional voltage blocking capability between nodes X and Y and between nodes Y and X.

Second leg 503 may be connected in parallel to first leg 502 and may feature back-to-back (e.g., having connected anodes) HV switches Q4 and Q5. HV switches are connected back-to-back to provide a high bidirectional voltage blocking capability between nodes X and Y and between nodes Y and X.

Figure 6:
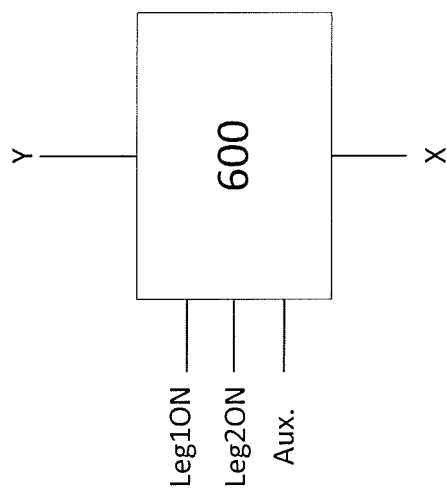
FIG. 6 is a block diagram according to one or more illustrative embodiments.

Reference is now made to FIG. 6, which shows an integrated switch circuit according to illustrative embodiments. Switch circuit 600 may be an integrated assembly (e.g., a PCB or a module) of switches Q1-Q4 of FIG. 1. Nodes X and Y may be externally available via externals terminals, the gate terminals of switches Q1-Q3 may be available via the Leg1ON terminal, and the gate terminal of switch Q4 may be available via the Leg2ON terminal. Terminals Leg1ON and Leg2ON may be coupled to suitable controller (e.g., a controller similar to or the same as controller 101 of FIG. 1). In some embodiments, a controller may be further integrated in switch circuit 600, with auxiliary power provided to the controller via auxiliary terminal Aux. Switches Q1-Q4 of FIG. 1 (along with other circuitry, for example, gate driver circuits) may be integrated using a single module package, or may be integrated as a fabrication structure (e.g., at a wafer level). Integrating components such as switches may provide lower cost, improved efficiency and increased ease-of-use. In some embodiments, an integrated controller may provide simpler control presented to a user. For example, the two terminals Leg1ON and Leg2ON may be unified to a single terminal for receiving simple logical ON/OFF command signals, and an internal controller may handle the timing configuration of FIG. 3.

In embodiments involving additional switches (e.g., switch Q5 of FIG. 4) or devices requiring control signals, switch circuit 600 may include additional terminals available for receiving control signals.

Embodiments disclosed herein employ switching legs having, for example, two or three MOSFETs connected in series. It is to be understood that other switches may be used instead of or in addition to MOSFETs, and any number of switches may be used. For example, eight 100V LVMs may be stacked to form an equivalent 800V switching leg connected in parallel to a leg having a 1200V IGBT. As another example, three 1200V IGBTs may be stacked to form an equivalent 3600V switching leg connected in parallel to a leg having a 3.3 kV SiCFET.

MOSFETs are used as examples of switches which come in low-voltage variants and high-voltage variants, and may be used to implement switches used to form switching circuits disclosed herein. Other types of switches may be used, such as bipolar junction transformers (BJTs), insulated gate bipolar transistors (IGBTs), gallium-nitride switches (GaNs), Silicon-Carbide switches (SiCs), and more.

For example, power BJTs or LV IGBTs may be used as LV switches Q1-Q3 of FIG. 1. Switch Q4 may be a superjunction MOSFET, a SiC switch or a GaN switch. Diode D1 of FIG. 2 may be a Schottky diode (e.g., for use in a low-voltage application), a silicon diode, a SiC diode, or a GaN Schottky diode.

As another example, switches Q1-Q3 of FIG. 1 may be thyristors, and switch Q4 may be an IGBT. In some embodiments, switches Q1-Q3 of FIG. 1 may be IGBTs and switch Q4 may be a SiC switch.

It is noted that various connections are set forth between elements herein. These connections are described in general and, unless specified otherwise, may be direct or indirect; this specification is not intended to be limiting in this respect. Further, elements of one embodiment may be combined with elements from other embodiments in appropriate combinations or subcombinations. For example, switch Q5 of FIG. 4 may replace diode D2 of FIG. 2.

What is claimed is:

1. A switching device comprising:
    a first leg comprising a plurality of transistors connected in series;
    a second leg comprising a transistor connected in series to a first diode, the second leg being connected in parallel to the first leg, wherein the transistor of the second leg includes a body diode, a source terminal, and a drain terminal, wherein an anode of the body diode is connected to the source terminal, wherein a cathode of the body diode is connected to the drain terminal, and wherein the first diode is oriented to prevent current from flowing through the body diode; and
    a controller controlling the plurality of transistors of the first leg and the transistor of the second leg,
    wherein the controller is configured to transition the switching device from a non-conduction period to a conduction period by first turning the transistor of the second leg from an OFF state to an ON state and then turning the plurality of transistors of the first leg from an OFF state to an ON state, and
    wherein the controller is further configured to transition the switching device from the conduction period to the non-conduction period by first turning the plurality of transistors of the first leg from the ON state to the OFF state and then turning the transistor of the second leg from the ON state to the OFF state.

2. The switching device of claim 1, wherein the plurality of transistors of the first leg comprise at least two low-voltage MOSFETs.

3. The switching device of claim 1, wherein the transistor of the second leg comprises a high-voltage MOSFET.

4. The switching device of claim 2, wherein the at least two low-voltage MOSFETs each have a rated maximum voltage of no more than 200V 120V.

5. The switching device of claim 1, further comprising a third leg coupled in parallel to the first leg and the second leg, the third leg comprising a second diode.

6. The switching device of claim 5, wherein the second diode is a Schottky diode.

7. The switching device of claim 5, wherein the second diode is a silicon-carbide diode.

8. The switching device of claim 1, wherein the second leg further comprises a second transistor connected in series with the transistor of the second leg.

9. The switching device of claim 5, wherein the second diode is oriented in a same direction as the body diode and having a lower conduction voltage compared to the body diode.

10. A method of forming a switching device, comprising:
    connecting a plurality of transistors in series to form a first leg;
    connecting a second leg in parallel to the first leg, the second leg comprising a transistor and a first diode connected in series, wherein the transistor of the second leg includes a body diode, a source terminal, and a drain terminal, wherein an anode of the body diode is connected to the source terminal, wherein a cathode of the body diode is connected to the drain terminal, and wherein the first diode is oriented to prevent current from flowing through the body diode; and controlling the plurality of transistors of the first leg and the transistor of the second leg by:

transitioning the switching device from non-conduction period to a conduction period by first turning the transistor of the second leg from an OFF state to an ON state and then turning the plurality of transistors of the first leg from an OFF state to an ON state, and transitioning the switching device from the conduction period to the non-conduction period by first turning the plurality of transistors of the first leg from the ON state to the OFF state and then turning the transistor of the second leg from the ON state to the OFF state.

11. The method of claim 10, further comprising:
connecting a third leg in parallel with the first leg and with the second leg, the third leg comprising a second diode oriented in a same direction as the body diode and having a lower conduction voltage compared to the body diode.

12. The method of claim 11, wherein the second diode is a Schottky diode.

13. The method of claim 11, wherein the second diode is a silicon-carbide diode.

14. The method of claim 10, wherein the plurality of transistors of the first leg comprise at least two low-voltage MOSFETs.

15. The method of claim 10, wherein the transistor of the second leg comprises a high-voltage MOSFET.

16. The method of claim 14, wherein the at least two low-voltage MOSFETs have a rated maximum voltage of no more than 200V.

17. The method of claim 10, further comprising:
connecting a second transistor connected in series with the transistor in the second leg.

18. A switching device comprising:
a first leg comprising a first plurality of transistors connected in series;
a second leg comprising a second plurality of transistors connected in series, the second leg connected in parallel to the first leg, wherein the second plurality of transistors comprise a first transistor connected in series to a first diode, wherein the first transistor comprises a body diode having an node connected to a source terminal of the first transistor and having a cathode connected to a drain terminal of the first transistor, and wherein the first diode is oriented to prevent current from flowing through the body diode; and
a controller controlling the first plurality of transistors of the first leg and the second plurality of transistors of the second leg,
wherein the controller is configured to transition the switching device from a non-conduction period to a conduction period by first turning the second plurality of transistors of the second leg from an OFF state to an ON state and then turning the first plurality of transistors of the first leg from an OFF state to an ON state, and
wherein the controller is further configured to transition the switching device from the conduction period to the non-conduction period by first turning the first plurality of transistors of the first leg from the ON state to the OFF state and then turning the second plurality of transistors of the second leg from the ON state to the OFF state.

* * * * *